(12) United States Patent
Hsu

(10) Patent No.: US 7,956,472 B2
(45) Date of Patent: Jun. 7, 2011

(54) PACKAGING SUBSTRATE HAVING ELECTRICAL CONNECTION STRUCTURE AND METHOD FOR FABRICATING THE SAME

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/188,663

(22) Filed: Aug. 8, 2008

(65) Prior Publication Data
US 2009/0041981 A1 Feb. 12, 2009

(30) Foreign Application Priority Data
Aug. 8, 2007 (TW) .............................. 96129156 A

(51) Int. Cl.
*H01L 23/48* (2006.01)
(52) U.S. Cl. ........ 257/779; 257/780; 257/781; 257/753; 257/759; 257/762; 257/766
(58) Field of Classification Search .......... 257/777–779, 257/781, 775, 753, 759, 762, 766; 428/618
See application file for complete search history.

(56) References Cited

U.S. PATENT DOCUMENTS

| | | | | |
|---|---|---|---|---|
| 3,986,255 | A * | 10/1976 | Mandal | 29/840 |
| 6,198,169 | B1 * | 3/2001 | Kobayashi et al. | 257/780 |
| 6,548,898 | B2 * | 4/2003 | Matsuki et al. | 257/746 |
| 6,664,128 | B2 * | 12/2003 | Tong et al. | 438/106 |
| 6,717,059 | B2 * | 4/2004 | Shintani et al. | 174/251 |
| 6,767,819 | B2 * | 7/2004 | Lutz | 438/614 |
| 7,081,402 | B2 * | 7/2006 | Hsu et al. | 438/612 |
| 7,151,050 | B2 * | 12/2006 | Hsu et al. | 438/614 |
| 7,199,036 | B2 * | 4/2007 | Chan et al. | 438/613 |

* cited by examiner

*Primary Examiner* — Cathy Lam
(74) *Attorney, Agent, or Firm* — Schmeiser, Olsen & Watts LLP

(57) ABSTRACT

A packaging substrate having an electrical connection structure and a method for fabricating the same are provided. The packaging substrate have a substrate body with a plurality of conductive pads on a surface thereof; a solder mask layer disposed on the substrate body with a plurality of openings corresponding to the conductive pads, the size of each of the openings being larger than each of the conductive pads; and electroplated solder bumps for covering the conductive pads to provide better bond strength and reliability.

3 Claims, 4 Drawing Sheets

PACKAGING SUBSTRATE HAVING ELECTRICAL CONNECTION STRUCTURE AND METHOD FOR FABRICATING THE SAME

BACKGROUND OF THE INVENTION

1. Field of the Invention

The present invention relates generally to packaging substrates having an electrical connection structure and methods for fabricating the same, and more particularly to, a packaging substrate having an electrical connection structure for electrically connecting a chip and a method for fabricating the same.

2. Description of Related Art

The current flip chip technique involves electrically connecting a semiconductor chip to a packaging substrate, wherein the semiconductor chip has a plurality of electrode pads on an active surface thereof, and the packaging substrate has a plurality of conductive pads corresponding to the electrode pad. A solder structure or other conductive adhesive material is disposed between the electrode pads and the corresponding conductive pads for providing electrical connection and mechanical connection between the semiconductor chip and the packaging substrate.

Referring to FIGS. 1A to 1F, a conventional method for fabricating an electrical connection structure for a packaging substrate is shown. First, as shown in FIG. 1A, a substrate body 10 with a plurality of conductive pads 11 on at least one surface thereof is provided. Then, as shown in FIG. 1B, a solder mask layer 12 is formed on the surface of the substrate body 10 and a plurality of openings 120 are formed in the solder mask layer 12 to expose the conductive pads 11. Subsequently, as shown in FIG. 1C, a mold plate 13 is disposed on the solder mask layer 12 and the mold plate 13 has a plurality of openings 130 corresponding to the openings 120 of the solder mask layer 12. Thereafter, as shown in FIG. 1D, solder bumps 14 are formed in the openings 130 of the mold plate 13 by coating or printing. Then, as shown in FIG. 1E, the mold plate is removed. Finally, as shown in FIG. 1F, the solder bumps 14 are reflowed to form solder bumps 14' to provide electrical connection for the substrate body 10.

In the above-described method, since the solder bumps 14 are filled in the openings 120 of he solder mask layer 12 and the openings 130 of the mold plate 13 by coating or printing, the quality of the solder bumps 14 is not easy to control, which can easily lead to poor uniformity in thickness and size of the solder bumps 14, thereby adversely affecting the electrical connection quality.

Further, in a flip-chip bonding packaging process, when the line width and pitch of a packaging substrate are reduced, the joint strength is decreased as the joint size is reduced. When temperature in a thermal recycling process of the fabrication process varies or the completed package is in use, the joint strength is not sufficient to endure the stress caused by a CTE difference between the chip and the substrate, thus 15 resulting in joint separation or breakage between the solder bumps 14' and the electrode pads and failing to provide a preferred electrical connection.

Therefore, how to overcome the above-described drawbacks has become urgent.

SUMMARY OF THE INVENTION

According to the above drawbacks, an object of the present invention is to provide a packaging substrate having an electrical connection structure and a method for fabricating the same so as to provide fine-pitch electrical connection.

Another object of the present invention is to provide a packaging substrate having an electrical connection structure and a method for fabricating the same such that electroplated solder bumps formed on the surfaces of the conductive pads have a preferred uniformity in thickness and size, thereby improving the product reliability and providing better electrical connection quality.

In order to attain the above and other objects, the present invention provides a packaging substrate having an electrical connection structure, which comprises: a substrate body having a plurality of conductive pads on a surface thereof; a solder mask layer disposed on the surface of the substrate body with a plurality of openings corresponding to the conductive pads, each of the openings being larger in size than each of the conductive pads; and electroplated solder bumps for covering the conductive pads.

In the above-described structure, the electroplated solder bumps are made of a material selected form the group consisting of Sn, Ag, Cu, Bi, Zn, In and alloy thereof. Also, a second conductive seed-layer is disposed between the conductive pad and the electroplated solder bump.

According to another embodiment, a metal bump is disposed between the conductive pad and the electroplated solder bump. The metal bumps protrude above the surface of the solder mask layer, and the metal bumps are made of a material selected form the group consisting of Cu, Ni/Au, Cr, Cu with Ni/Pd/Au surface treatment, Cu with Au surface treatment, and Cu with Ni/Au surface treatment. According to a further embodiment, a metal attachment layer is disposed between the conductive pad and the electroplated solder bump, and the metal attachment layer is made of a material selected form the group consisting of Ni, Ni/Au, Zn and Ni/Pd/Au.

The above-described structure further comprises a first conductive seed-layer disposed between the substrate body and the conductive pad, and a second conductive seed-layer disposed between the conductive pad and the electroplated solder bump or disposed between the conductive pad and the metal bump.

The present invention further provides a method for fabricating a packaging substrate having an electrical connection structure, which comprises: providing a substrate body having a plurality of conductive pads on a surface thereof; forming on the surface of the substrate body a solder mask layer with a plurality of openings for completely exposing the conductive pads; forming a second conductive seed-layer on a surface of the solder mask layer, inner walls of the openings of the solder mask layer and surfaces of the conductive pads; forming on the surface of the second conductive seed-layer a first resist layer with a plurality of first openings to expose a part of the second conductive seed-layer, wherein each of the first openings is larger in size than each of the conductive pads and smaller in size than each of the openings of the solder mask layer; and forming electroplated solder bumps in the first openings through the second conductive seed-layer, allowing the electroplated solder bumps to protrude above the surface of the solder mask layer.

The above-described method further comprises removing the first resist layer and the second conductive seed-layer covered by the first resist layer, and performing a reflowing process. The electroplated solder bumps are made of a material selected form the group consisting of Sn, Ag, Cu, Bi, Zn, In and alloy of a combination thereof.

According to another embodiment, the method comprises forming metal bumps in the first openings through the second conductive seed-layer by electroplating for covering the conductive pads before formation of the electroplated solder bumps. The metal bumps protrude above the surface of the solder mask layer, and the metal bumps are made of a material selected form the group consisting of Cu, Ni/Au, Cr, Cu with Ni/Pd/Au surface treatment, Cu with Au surface treatment, and Cu with Ni/Au surface treatment.

According to a further embodiment, the method comprises forming a metal attachment layer on the surfaces of the conductive pads before formation of the second conductive seed-layer. The metal attachment layer is formed by one of chemical deposition and physical deposition. The metal attachment layer is made of a material selected form the group consisting of Ni, Ni/Au, Zn, and Ni/Pb/Au.

Therefore, the electroplated solder bumps are formed in the openings of the solder mask layer, uniformly formed on the surface of the second conductive seed-layer and covering the conductive pads. Further, since the electroplated solder bumps have less quality variance, after a reflowing process applied thereto, the reflowed electroplated solder bumps are uniform in thickness and size. Further, the electroplated solder bumps with much larger height can reduce joint stress, thereby improving the electrical connection reliability of the electroplated solder bumps and meeting the fine-pitch requirement.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

FIGS. 2A to 2H are sectional diagrams showing a method for fabricating a packaging substrate having an electrical connection structure according to a first embodiment of the present invention.

Figure 1A:
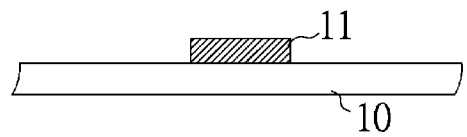
FIGS. 1A to 1F are diagrams showing a conventional method for fabricating an electrical connection structure for a packaging substrate.
Figure 1D:
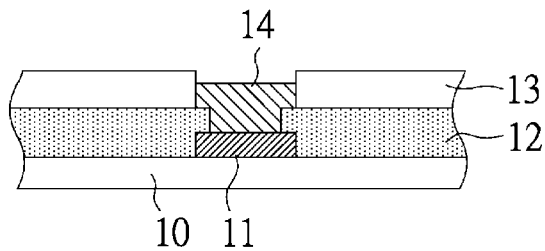
Figure 1B:
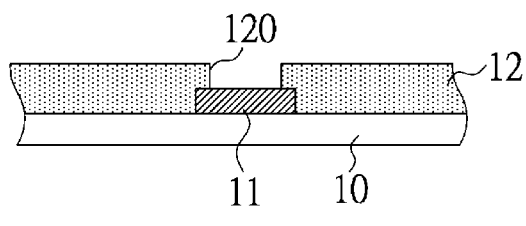
Figure 1E:
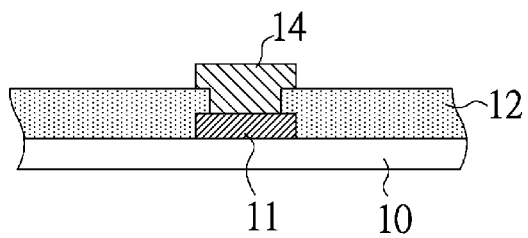
Figure 1C:
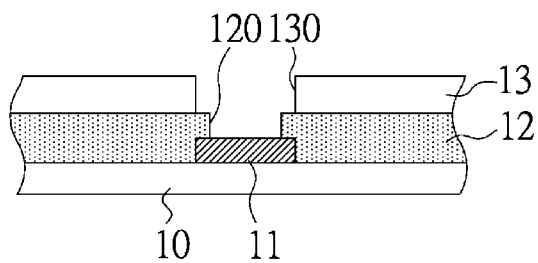
Figure 1F:
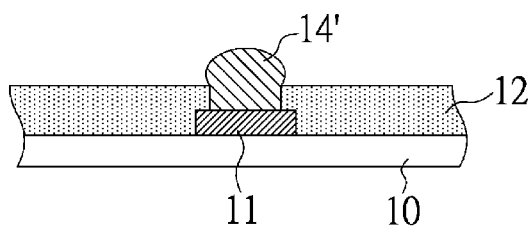
Figure 2A:
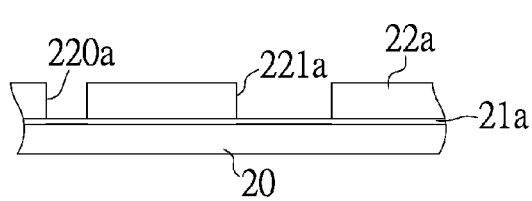
FIGS. 2A to 2H are diagrams showing a method for fabricating a packaging substrate having electrical connection structure according to a first embodiment of the present invention.

As shown in FIG. 2A, a substrate body 20 is provided, a first conductive seed-layer 21a is formed on a surface thereof and a patterned resist layer 22a is formed on the surface of the first conductive seed-layer 21a. The resist layer 22a has a plurality of openings 220a, 221a to expose a part of the first conductive seed-layer 21a.

Figure 2E:
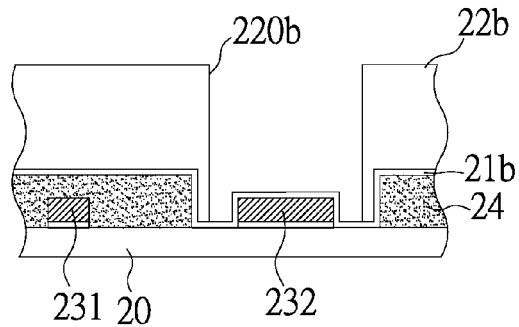
Figure 2B:
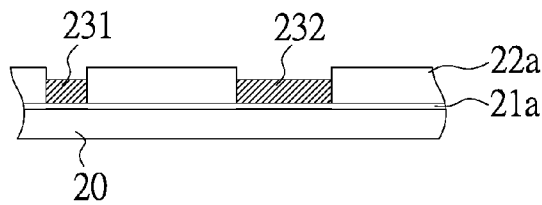

As shown in FIG. 2B, through an electroplating process, circuit 231 is formed in the openings 220a of the first conductive seed-layer 21a and meanwhile conductive pads 232 are formed in the openings 221a. The circuit 231 and the conductive pads 232 can be made of copper.

Figure 2F:
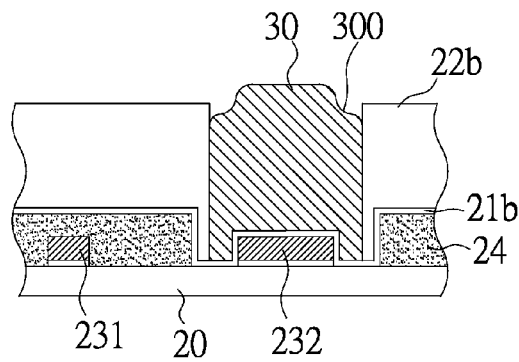
Figure 2C:
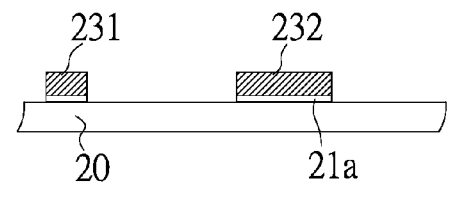

As shown in FIG. 2C, the patterned resist layer 22a and the first conductive seed-layer 21a covered by the resist layer 22a are removed to expose the circuit 231 and the conductive pads 232.

Figure 2G:
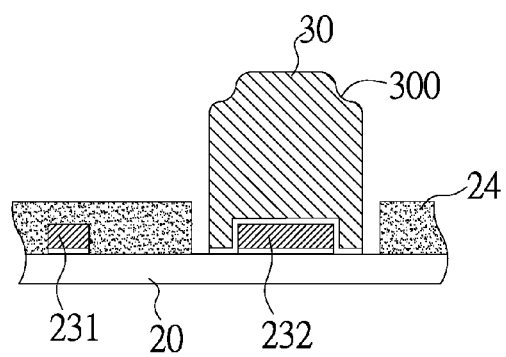
Figure 2D:
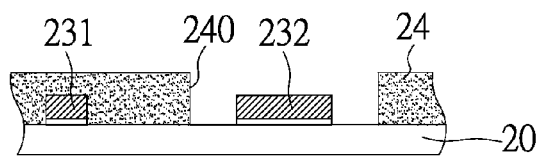

As shown in FIG. 2D, a solder mask layer 24 is formed on the surface of the substrate body 20, and openings 240 are formed in the solder mask layer 24 to completely expose the conductive pads 232.

As shown in FIG. 2E, a second conductive seed-layer 21b is formed on a surface of the solder mask layer 24, the inner walls of the openings 240 and surfaces of the conductive pads 232. A first resist layer 22b is formed on the surface of the second conductive seed-layer 21b with a plurality of first openings 220b to expose a part of the second conductive seed-layer 21b. The size of each of the first openings 220b is larger than the size of each of the conductive pads 232 and smaller than the size of each of the openings 240 of the solder mask layer 24.

As shown in FIG. 2F, electroplated solder bumps 30 are formed in the first openings 220b through the second conductive seed-layer 21b to completely enclose the conductive pads 232. The electroplated solder bumps 30 can be made of a material selected from the group consisting of Sn, Pb, Cu, Ag, Bi, Zn, In and alloy thereof. The electroplated solder bumps 30 protrude above the surface of the solder mask layer 24. Since the electroplating process is isotropic, a concave portion 300 is formed around the periphery of the top of the electroplated solder bumps 30.

As shown in FIG. 2G, the first resist layer 22b and the second conductive seed-layer 21b covered by the first resist layer 22b are removed to expose the electroplated solder bumps 30.

Figure 2H:
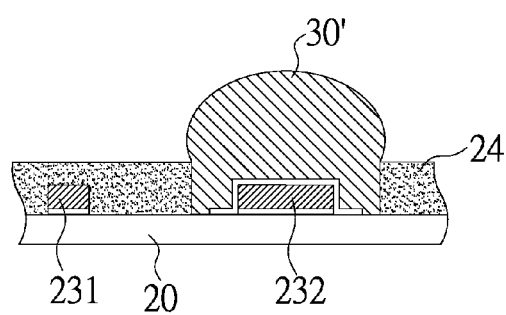

As shown in FIG. 2H, the electroplated solder bumps 30 are reflowed to form electroplated solder bumps 30' that fill the openings 240 of the solder mask layer 24 and protrude above the surface of the solder mask layer 24. Thus, the electroplated solder bumps 30' that are uniform in thickness and size are formed on the surfaces of the conductive pads 232, thereby reducing joint stress for the package in a thermal recycling process or in use and providing better electrical connection quality and meeting the fine-pitch requirement.

Referring to FIG. 2G, the present invention further provides a packaging substrate having an electrical connection structure, which comprises: a substrate body 20 having a plurality of conductive pads 232 and circuit 231 formed on a surface thereof; a solder mask layer 24 disposed on the surface of the substrate body 20 and having a plurality of openings 240 corresponding to the conductive pads 232, wherein each of the openings 240 is larger in size than each of the conductive pads 232; and electroplated solder bumps 30 for completely enclosing the conductive pads 232 and protruding above the surface of the solder mask layer 24. The electroplated solder bumps are made of a material selected from the group consisting of Sn, Ag, Cu, Bi, Zn, In and alloy of a combination thereof.

In the above structure, the electroplated solder bumps 30 can be reflowed to form electroplated solder bumps 30' that fill the openings 240 of the solder mask layer 24 and protrude above the surface of the solder mask layer 24. Referring to FIG. 2H, since the electroplated solder bumps 30' formed on the surfaces of the conductive pads 232 are uniform in thickness and size, joint stress for the package can be reduced, thereby providing better electrical connection quality and meeting the fine-pitch requirement.

Second Embodiment

FIGS. 3A to 3E are sectional diagrams showing a method for fabricating a packaging substrate having an electrical connection structure according to a second embodiment of the present invention. A difference of the present embodiment from the first embodiment is metal bumps are formed between the conductive pads and the electroplated solder bumps.

Figure 3A:
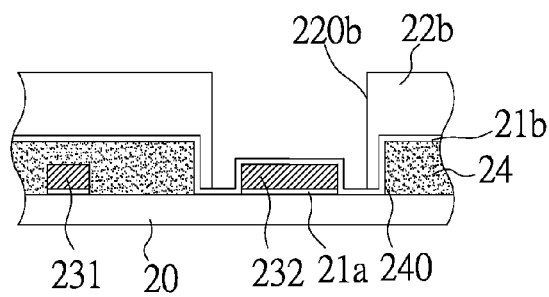
FIGS. 3A to 3E are diagrams showing a method for fabricating a packaging substrate having electrical connection structure according to a second embodiment of the present invention.

As shown in FIG. 3A, a structure as shown in FIG. 2E is provided, a plurality of first openings 220b are formed in the first resist layer 22b to expose part of the second conductive seed-layer 21b, wherein each of the first openings 220b is larger in size than each of the conductive pads 232 and smaller in size than each of the openings 240 of the solder mask layer 24.

Figure 3D:
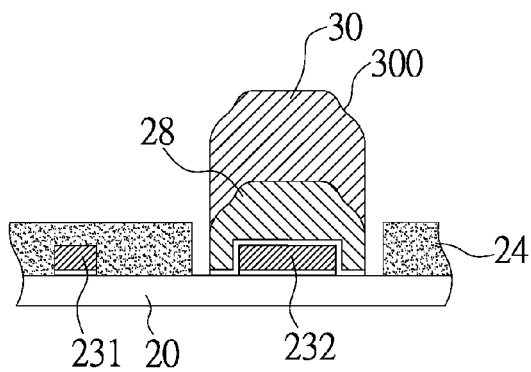
Figure 3B:
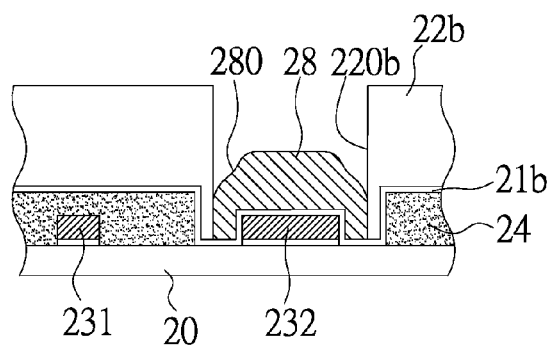

As shown in FIG. 3B, metal bumps 28 are formed in the first openings 220b through the second conductive seed-layer 21b by electroplating to completely enclose the conductive pads 232. The metal bumps 28 can protrude above the surface of the 25 solder mask layer 24. Since the electroplating process is isotropic, a concave portion 280 is formed around the periphery of the top of the metal bumps 28. The metal bumps 28 can be made of one of Cu, Ni/Au, Cr, Cu with Ni/Pd/Au surface treatment, Cu with Au surface treatment, and Cu with Ni/Au surface treatment.

Figure 3E:
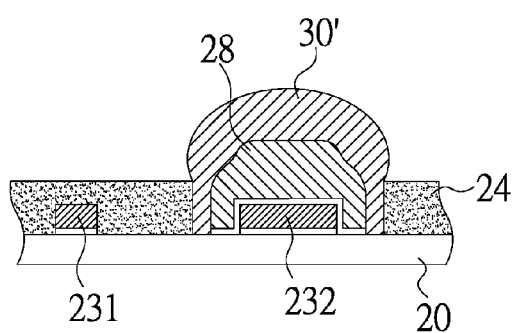
Figure 3C:
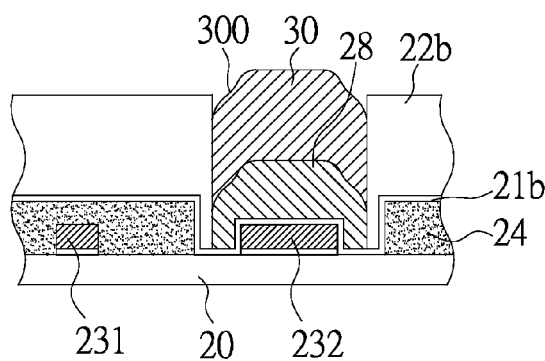

As shown in FIG. 3C, electroplated solder bumps 30 are formed on the surfaces of the metal bumps 28. Since the electroplating process is isotropic, a concave portion 300 is formed around the periphery of the top of the electroplated solder bumps 30.

As shown in FIG. 3D, the first resist layer 22b and the second conductive seed-layer 21b covered by the first resist layer 22b are removed to expose the electroplated solder bumps 30 and the metal bumps 28.

As shown in FIG. 3E, the electroplated solder bumps 30 are reflowed to form electroplated solder bumps 30' that enclose the metal bumps 28 and fill the openings 240 of the solder mask layer 24.

The present invention further provides a packaging substrate having an electrical connection structure, which has: a substrate body 20 having a plurality of conductive pads 232 and circuit 231 formed on a surface thereof; a solder mask layer 24 formed on the surface of the substrate body 20 and having a plurality of openings 240 corresponding in position to the conductive pads 232, wherein each of the openings 240 is larger in size than each of the conductive pads 232; a plurality of metal bumps 28 for covering the conductive pads 232 and protruding above surface of the solder mask layer 24; and electroplated solder bumps 30 disposed on the metal bumps 28, as shown in FIG. 3D. The electroplated solder bumps 30 can be reflowed to form electroplated solder bumps 30' to enclose the metal bumps 28 and fill the openings 240 of the solder mask layer 24, as shown in FIG. 3E.

The above-described structure further comprises a first conductive seed-layer 21a disposed between the substrate body 20 and the circuit 231 as well as the conductive pad 232; and a second conductive seed-layer 21b disposed between the conductive pad 232 and the metal bump 28.

Therefore, a larger bump height is obtained through the metal bumps 28 and the electroplated solder bumps 30' so as to reduce joint stress for the package in a thermal cycling process or in use, thereby avoiding joint separation or breakage phenomenon and meeting the fine-pitch requirement.

Third Embodiment

FIGS. 4A to 4E are sectional diagrams showing a method for fabricating a packaging substrate having an electrical connection structure according to a third embodiment of the present invention. A difference of the present embodiment from the above-described embodiments is a metal attachment layer is formed between the conductive pads and the electroplated solder bumps.

Figure 4A:
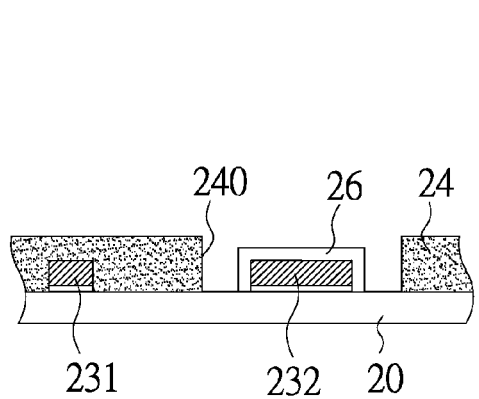
FIGS. 4A to 4E are diagrams showing a method for fabricating a packaging substrate having electrical connection structure according to a third embodiment of the present invention.

As shown in FIG. 4A, a structure as shown in FIG. 2D is provided, a metal attachment layer 26 is formed on the surfaces of the conductive pads 232 by chemical deposition or physical deposition and covering the conductive pads 232. The metal attachment layer 26 can be made of one of Ni, Ni/Au, Zn, and Ni/Pd/Au.

Figure 4D:
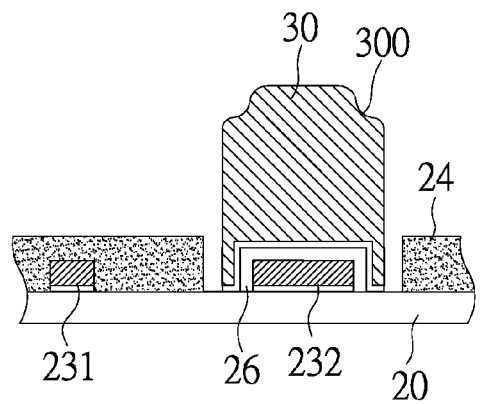
Figure 4B:
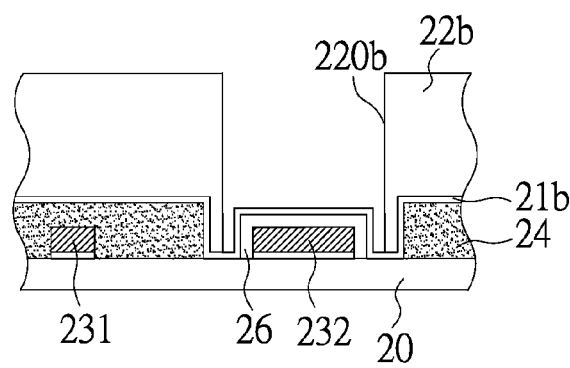

As shown in FIG. 4B, a second conductive seed-layer 21b is formed on the surface of the solder mask layer 24, the inner walls of the openings 240 and a surface of the metal attachment layer 26. A first resist layer 22b is formed on a surface of the second conductive seed-layer 21b and a plurality of first openings 220b are formed in the first resist layer 22b to expose a part of the second conductive seed-layer 21b. Moreover, each of the first openings 220b is larger in size than each of the conductive pads 232 and smaller in size than each of the openings 240 of the solder mask layer 24.

Figure 4E:
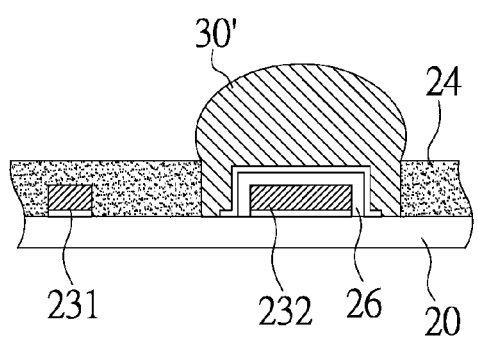
Figure 4C:
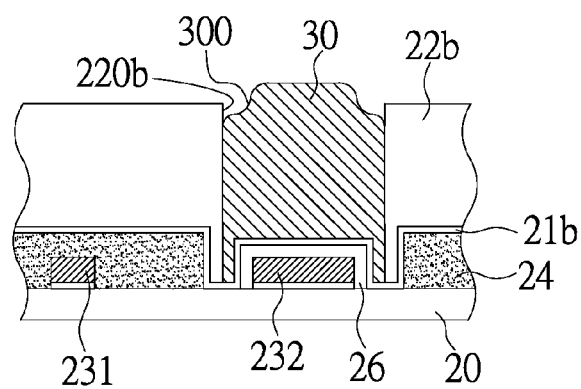

As shown in FIG. 4C, electroplated solder bumps 30 are formed in the first openings 220b through the second conductive seed-layer 21b. The electroplated solder bumps 30 protrude above the surface of the solder mask layer 24. Since the electroplating process is isotropic, a concave portion 300 is formed around the periphery of the top of the electroplated solder bumps 30.

As shown in FIG. 4D, the first resist layer 22b and the second conductive seed-layer 21b covered by the first resist layer 22b are removed to expose the electroplated solder bumps 30.

As shown in FIG. 4E, the electroplated solder bumps 30 are reflowed to form electroplated solder bumps 30' that fill the openings 240 of the solder mask layer 24 and protrude above the surface of the solder mask layer 24. Thus, the electroplated solder bumps 30' that are uniform in thickness and size are formed on the surfaces of the conductive pads 232, thereby reducing joint stress for the package in a thermal recycling process or in use and providing better electrical connection quality and meeting the fine-pitch requirement.

The present invention further provides a packaging substrate having an electrical connection structure, which has: a substrate body 20 having a plurality of conductive pads 232 and circuit 231 formed on a surface thereof; a metal attachment layer 26 for covering the conductive pads 232; a solder mask layer 24 disposed on the surface of the substrate body 20 and having a plurality of openings 240 corresponding in position to the conductive pads 232, wherein the size of each of the openings 240 is larger than that of each of the conductive pads 232; and electroplated solder bumps 30 for covering the metal attachment layer 26 and protruding above surface of the solder mask layer 24, as shown in FIG. 4D. The electroplated solder bumps 30 can be reflowed to form electroplated solder bumps 30' which fill the openings 240 of the solder mask layer 24, as shown in FIG. 4E.

The metal attachment layer 26 is used to increase the contact area between the conductive pads and the electroplated solder bumps 30' and reduce formation of intermetallic complex between the electroplated solder bumps 30' and the conductive pads 232, thereby providing better electrical connection quality and reducing joint stress for the package in a thermal cycling process or in use so as to avoid joint separation or breakage phenomenon and meet the fine-pitch requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A packaging substrate having electrical connection structures, comprising:
    a substrate body having a plurality of conductive pads on a surface thereof;
    a solder mask layer disposed on the surface of the substrate body and formed with a plurality of openings corresponding in position to the conductive pads, each of the openings being larger in size than each of the conductive pads;
    copper bumps disposed on the conductive pads for fully covering the conductive pads exposed from the openings, and the copper bumps protrude above the solder mask layer, each of the openings is larger in size than each of the copper bumps;
    electroplated solder bumps mounted on the copper bumps for fully covering the copper humps exposed from the openings, wherein the electroplated solder bumps fill the openings: and
    a conductive seed-layer formed between the conductive pads and the copper bumps.

2. The packaging substrate of claim 1, wherein the electroplated solder bumps are made of a material selected from the group consisting of Sn, Ag, Bi, Zn, In and alloy of a combination thereof.

3. The packaging substrate of claim 1, wherein the electroplated solder bumps protrude above the solder mask layer.

* * * * *